US012121857B2

(12) United States Patent
Bae et al.

(10) Patent No.: US 12,121,857 B2
(45) Date of Patent: Oct. 22, 2024

(54) PIPING APPARATUS HAVING HARMFUL GAS TREATMENT DEVICE, DESIGN METHOD THEREFOR, AND HARMFUL GAS TREATMENT FACILITY COMPRISING SAME

(71) Applicants: LOT CES CO., LTD., Osan-si (KR); LOT VACUUM CO., LTD., Osan-si (KR)

(72) Inventors: Jin Ho Bae, Hwaseong-si (KR); Yu Jin Lee, Seoul (KR); Hyung Jun Kim, Jeonju-si (KR); Jeong Kyun Ra, Hwaseong-si (KR); Ho Sik Kim, Hwaseong-si (KR); Won Hong Ju, Cheonan-si (KR)

(73) Assignees: LOT CES CO., LTD., Osan-si (KR); LOT VACUUM CO., LTD., Osan-si (KR)

( * ) Notice: Subject to any disclaimer, the term of this patent is extended or adjusted under 35 U.S.C. 154(b) by 986 days.

(21) Appl. No.: 16/973,767

(22) PCT Filed: Apr. 17, 2019

(86) PCT No.: PCT/KR2019/004620
§ 371 (c)(1),
(2) Date: Dec. 10, 2020

(87) PCT Pub. No.: WO2020/013426
PCT Pub. Date: Jan. 16, 2020

(65) Prior Publication Data
US 2021/0245098 A1 Aug. 12, 2021

(30) Foreign Application Priority Data

Jul. 11, 2018 (KR) .................. 10-2018-0080624
Jan. 28, 2019 (KR) .................. 10-2019-0010579

(51) Int. Cl.
*B01D 53/86* (2006.01)
*F27D 17/00* (2006.01)
*G01N 25/12* (2006.01)

(52) U.S. Cl.
CPC ....... *B01D 53/8659* (2013.01); *F27D 17/008* (2013.01); *G01N 25/12* (2013.01); *B01D 2257/204* (2013.01); *B01D 2258/0216* (2013.01)

(58) Field of Classification Search
None
See application file for complete search history.

(56) References Cited

U.S. PATENT DOCUMENTS

2004/0229419 A1* 11/2004 Namose ............ H01J 37/32844
438/202
2011/0206585 A1 8/2011 Hara et al.

FOREIGN PATENT DOCUMENTS

JP 10-054356 A 2/1998
KR 10-2006-0065823 A 6/2006
(Continued)

OTHER PUBLICATIONS

KR2016109777A—translated document (Year: 2016).*
(Continued)

*Primary Examiner* — Jelitza M Perez
(74) *Attorney, Agent, or Firm* — Revolution IP, PLLC

(57) ABSTRACT

A piping apparatus includes an exhaust pipe providing a passage through which the exhaust gas discharged, and a harmful gas treatment device positioned between a rear end of the vacuum pump and a front end of the exhaust pipe or positioned on the exhaust pipe, wherein the harmful gas treatment device includes a heating means for increasing the temperature of the exhaust gas so as to prevent a sublimable component, from among components included in the exhaust gas, from being sublimated and accumulated inside (Continued)

the exhaust pipe, and the heating means is positioned on a section including a sublimation condition occurrence point, at which a sublimation condition of the sublimable component occurs, and an upstream side of the sublimation condition occurrence point on the exhaust pipe, and the sublimation condition is a temperature condition for the pressure of the sublimable component.

9 Claims, 4 Drawing Sheets

(56) References Cited

FOREIGN PATENT DOCUMENTS

| KR | 100656538 B1 | * | 12/2006 | ............ B01D 51/32 |
|----|---|---|---|---|
| KR | 10-1291982 B1 | | 8/2013 | |
| KR | 10-2016-0109777 A | | 9/2016 | |
| KR | 2016109777 A | * | 9/2016 | ............ H01L 21/02 |
| KR | 20-2017-0001594 U | | 5/2017 | |
| KR | 10-2018-0066572 A | | 6/2018 | |
| WO | WO-2017132186 A1 | * | 8/2017 | ........... B01D 53/002 |

OTHER PUBLICATIONS

KR100656538B1—translated document (Year: 2006).*
International Search Report for PCT/KR2019/004620 mailed Jul. 23, 2019 from Korean Intellectual Property Office.

* cited by examiner

PIPING APPARATUS HAVING HARMFUL GAS TREATMENT DEVICE, DESIGN METHOD THEREFOR, AND HARMFUL GAS TREATMENT FACILITY COMPRISING SAME

TECHNICAL FIELD

The present invention relates to technology for treating harmful gas contained in exhaust gas discharged from a process chamber, and more particularly, to a piping apparatus having a harmful gas treatment device that is capable of suppressing the generation of powder in an exhaust pipe by treating a harmful gas contained in an exhaust gas generated in the process chamber and discharged through the exhaust pipe, a design method therefor, and a harmful gas treatment facility including the same.

BACKGROUND ART

In general, in order to manufacture a semiconductor or display, various materials are injected into a process chamber having a low pressure, and processes, such as ashing, deposition etching, photolithography, cleaning, and nitrification, are performed. A harmful gas including materials corresponding to environment regulation materials, such as a variety of volatile organic compounds, acids, odour-causing gases, ignition materials, green-house gases, or perfluorocarbons (PFCs), are generated or used in these processes.

In particular, gases called PFCs such as $CF_4$, $SF_6$, $C_2F_6$, $C_3F_8$, and the like, are widely used in an etching process, thin-film deposition, and reactor cleaning steps. These PFCs are mostly inert gases and have a very long natural decomposition time in the atmosphere and are recognized as a main culprit for destruction of an ozone layer and thus strong regulations are progressed in the use of a semiconductor process.

Exhaust gas including a harmful gas generated in the process chamber and discharged by a vacuum pump is treated by a scrubber. Powder is generated in a pipe for connecting the vacuum pump to the scrubber. Gas, such as ammonium chloride ($NH_4Cl$), contained in the exhaust gas that passes through the pipe is generated due to sublimation caused by temperature fall or pressure rising.

DETAILED DESCRIPTION OF THE INVENTION

Technical Problem

The present invention provides a piping apparatus that is capable of preventing powder from being generated in an exhaust pipe when part of components of exhaust gas discharged by a vacuum pump is sublimated, a design method therefor, and a harmful gas treatment facility including the same.

Technical Solution

According to an aspect of the present invention, there is provided a piping apparatus in which exhaust gas discharged from a process chamber by a vacuum pump flows, the piping apparatus including: an exhaust pipe providing a passage through which the exhaust gas discharged by the vacuum pump flows; and a harmful gas treatment device positioned between a rear end of the vacuum pump and a front end of the exhaust pipe or positioned on the exhaust pipe so as to treat a harmful gas contained in the exhaust gas, wherein the harmful gas treatment device includes a heating means for increasing the temperature of the exhaust gas so as to prevent a sublimable component, from among components included in the exhaust gas from being sublimated and accumulated inside the exhaust pipe, and the heating means is positioned on a section including a sublimation condition occurrence point, at which a sublimation condition of the sublimable component occurs, and an upstream side of the sublimation condition occurrence point on the exhaust pipe, and the sublimation condition is a temperature condition for the pressure of the sublimable component.

According to another aspect of the present invention, there is provided a harmful gas treatment facility including: a vacuum pump for discharging exhaust gas including a harmful gas generated in a process chamber; an exhaust pipe providing a passage through which the exhaust gas discharged by the vacuum pump flows; and a harmful gas treatment device positioned between a rear end of the vacuum pump and a front end of the exhaust pipe or positioned on the exhaust pipe so as to treat a harmful gas contained in the exhaust gas, wherein the harmful gas treatment device includes a heating means for increasing the temperature of the exhaust gas so as to prevent a sublimable component, from among components included in the exhaust gas, from being sublimated and accumulated inside the exhaust pipe, and the heating means is positioned on a section including a sublimation condition occurrence point, at which a sublimation condition of the sublimable component occurs, and an upstream side of the sublimation condition occurrence point on the exhaust pipe, and the sublimation condition is a temperature condition for the pressure of the sublimable component.

According to another aspect of the present invention, there is provided a design method for a piping apparatus in which exhaust gas discharged from a process chamber by a vacuum pump flows, the piping apparatus including an exhaust pipe providing a passage through which the exhaust gas discharged by the vacuum pump flows, and a harmful gas treatment device positioned between a rear end of the vacuum pump and a front end of the exhaust pipe or positioned on the exhaust pipe so as to treat a harmful gas contained in the exhaust gas, the design method including: measuring temperature and pressure of the exhaust gas that flows through the passage by performing a discharge simulation of the exhaust gas using a computer before the harmful gas treatment device is installed; calculating a partial pressure of a sublimable component, from among components included in the exhaust gas using the computer; calculating a sublimation position where temperature of the exhaust gas reaches a sublimation temperature for the pressure of the sublimable component, as a sublimation point using the computer; and setting a section of the exhaust pipe including the sublimation point and an upstream side of the sublimation point as an installable position of the harmful gas treatment device.

Effects of the Invention

According to the present invention, the above-described objects of the present invention can be achieved. In detail, according to the present invention, a harmful gas treatment device including a plasma reaction part and a catalyst treatment part on a pipe for connecting a vacuum pump to a scrubber is installed between a rear end of the vacuum pump and a position where a sublimation condition of a sublimable component included in exhaust gas is not constituted, so that part of components of the exhaust gas is not sublimated within the pipe and thus powder can be prevented from being formed.

MODE OF THE INVENTION

Hereinafter, the configuration and operation of embodiments of the present invention will be described in detail with reference to the attached drawings.

Figure 1:
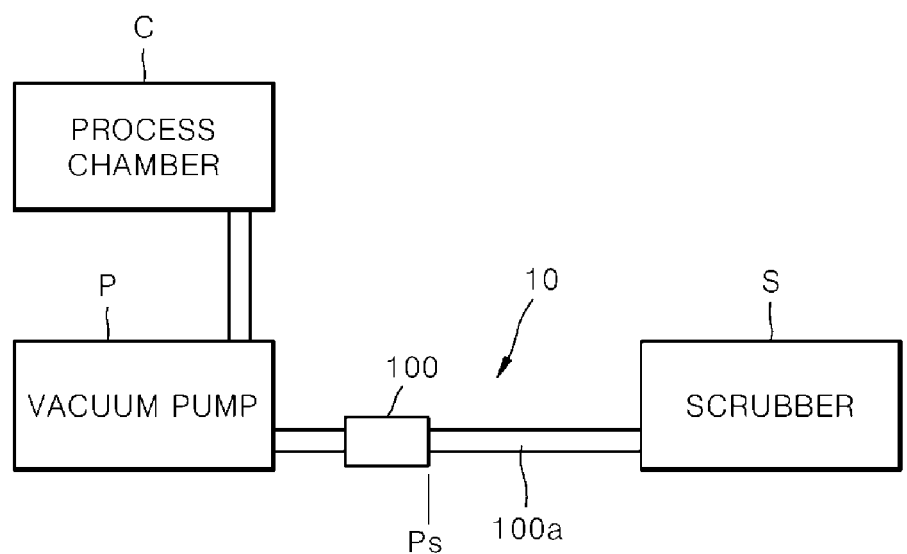
FIG. 1 is a view schematically illustrating a configuration of a harmful gas treatment facility using a harmful gas treatment device according to an embodiment of the present invention.

FIG. 1 is a block diagram showing the configuration of a harmful gas treatment facility using a harmful gas treatment device according to an embodiment of the present invention. Referring to FIG. 1, the harmful gas treatment facility includes a process chamber C for generating harmful gas to be treated, a vacuum pump P for discharging exhaust gas including the harmful gas generated in the process chamber C, a scrubber S for treating exhaust gas discharged by the vacuum pump P, and a piping apparatus 10 installed between the vacuum pump P and the scrubber S. The features of the present invention are the piping apparatus 10 installed between the vacuum pump P and the scrubber S, and the process chamber C, the vacuum pump P, and the scrubber S that are the remaining configurations excluding the piping apparatus 10 in the harmful gas treatment facility may be modified and revised within the scope of a general technology relating to the present invention.

The piping apparatus 10 is connected to a rear end of the vacuum pump P so that the exhaust gas discharged from the process chamber C by the vacuum pump P flows in the piping apparatus 10. In the present embodiment, the piping apparatus 10 is connected to the rear end of the vacuum pump P. However, embodiments are not limited thereto. Other configurations may be installed between the rear end of the vacuum pump P and the piping apparatus 10 and also belong to the scope of the present invention. The piping apparatus 10 includes an exhaust pipe 100a for connecting the vacuum pump P to the scrubber S and a harmful gas treatment device 100 installed on the exhaust pipe 100a.

The exhaust pipe 100a connects the vacuum pump P to the scrubber S and provides a passage through which the exhaust gas discharged from the rear end of the vacuum pump P flows. The exhaust gas discharged by the vacuum pump P via the exhaust pipe 100a is introduced into the scrubber S. The harmful gas treatment device 100 is installed on the exhaust pipe 100a.

Figure 2:
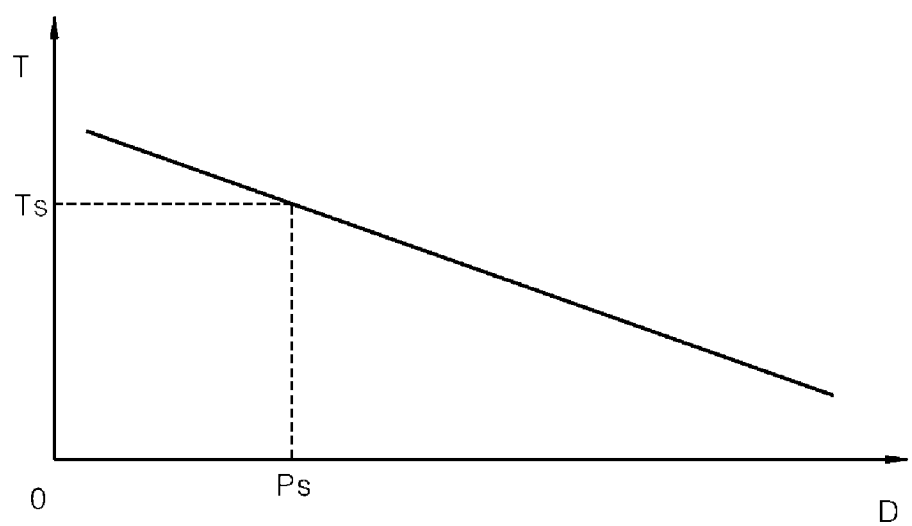
FIG. 2 is a graph showing the relationship between a flow distance and a temperature of exhaust gas in an exhaust pipe for connecting a vacuum pump and a scrubber when there is no harmful gas treatment device of FIG. 1.

FIG. 2 is a graph showing the temperature of the exhaust gas that passes through the exhaust pipe 100a when there is no harmful gas treatment device 100 in the exhaust pipe 100a. In FIG. 2, the horizontal axis represents a distance from the vacuum pump P on the exhaust pipe 100a, i.e., a flowing distance of the exhaust gas on the exhaust pipe 100a, and the vertical axis represents the temperature of the exhaust gas at a corresponding position. As shown in FIG. 2, the temperature of the exhaust gas that passes through the exhaust pipe 100a is decreased as being far away from the vacuum pump P.

Figure 3:
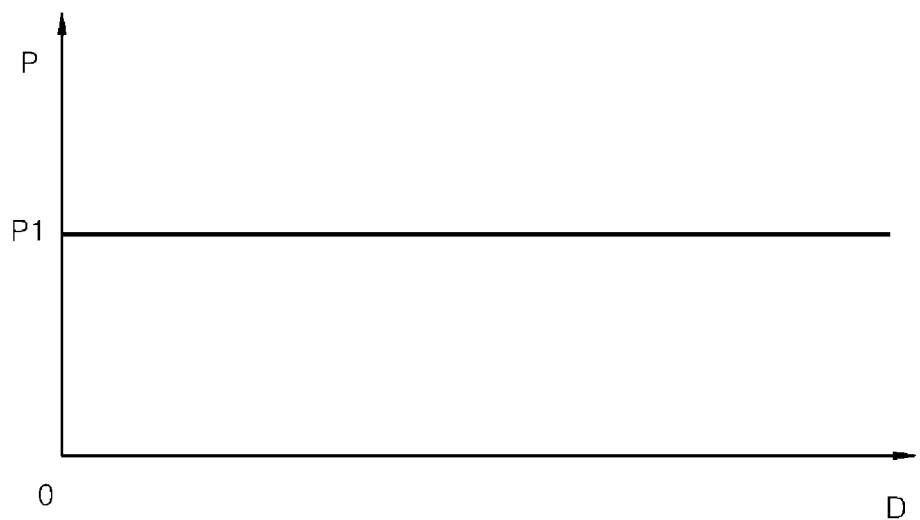
FIG. 3 is a graph showing the relationship between a flow distance and a pressure of exhaust gas in an exhaust pipe for connecting a vacuum pump and a scrubber when there is no harmful gas treatment device of FIG. 1.

FIG. 3 is a graph showing the pressure of the exhaust gas that passes through the exhaust pipe 100a when there is no harmful gas treatment device 100 in the exhaust pipe 100a. In FIG. 3, the horizontal axis represents a distance from the vacuum pump P on the exhaust pipe 100a, i.e., a flowing distance of the exhaust gas on the exhaust pipe 100a, and the vertical axis represents the pressure of the exhaust gas at a corresponding position. As shown in FIG. 3, the pressure of the exhaust gas that passes through the exhaust pipe 100a is kept mostly at a constant level.

The harmful gas treatment device 100 is installed at an appropriate position of the exhaust pipe 100a according to temperature and pressure conditions of the exhaust gas. In the present embodiment, "on the exhaust pipe 100a" means both front and rear ends of the exhaust pipe 100a. Installing of the harmful gas treatment device 100 on the exhaust pipe 100a means not only the case where the harmful gas treatment device 100 is located in the middle of the exhaust pipe 100a, as shown in FIG. 1, but also the case where the harmful gas treatment device 100 is connected to the front end or the rear end of the exhaust pipe 100a.

Figure 4:
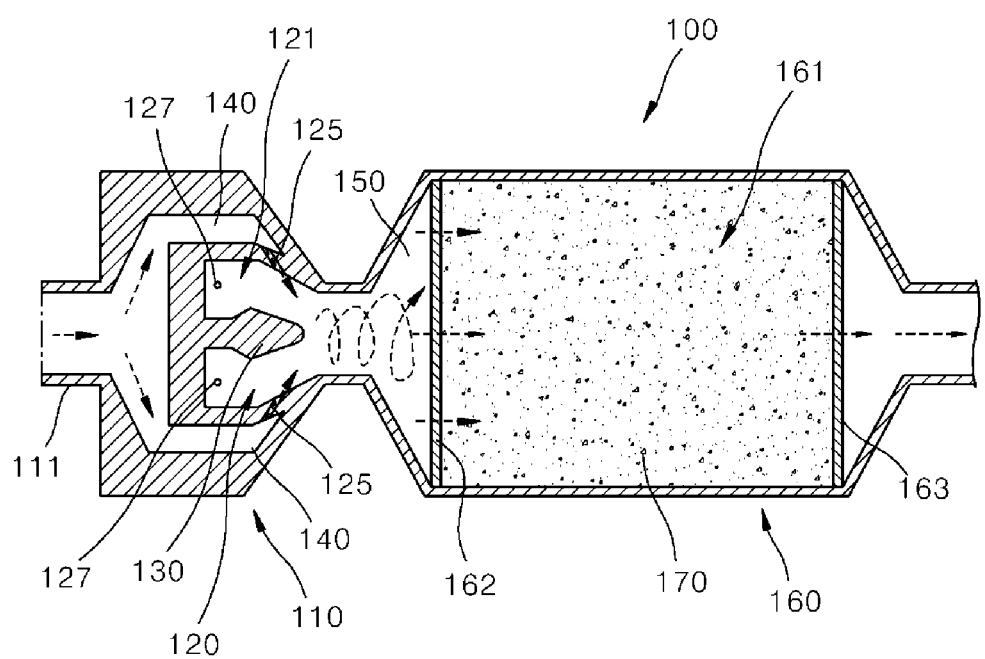
FIG. 4 is a longitudinal cross-sectional view showing an embodiment of the harmful gas treatment device illustrated in FIG. 1.

The harmful gas treatment device 100 is installed on the exhaust pipe 100a, treats a harmful gas contained in the exhaust gas that flows through the exhaust pipe 100a, and prevents powder from being generated in the exhaust pipe 100a. FIG. 4 is a longitudinal cross-sectional view showing an embodiment of the harmful gas treatment device 100. Referring to FIG. 4, the harmful gas treatment device 100 according to an embodiment of the present invention includes a plasma reaction part 110 in which a plasma reaction for harmful gas treatment occurs and which functions as a heating means, and a catalyst treatment part 160 which is located at a lower position than where the plasma reaction part 110 is located, and which treats the harmful gas using a catalyst.

The plasma reaction part 110 is located upstream compared to the catalyst treatment part 160 on a flow path of a gas. The plasma reaction part 110 causes a plasma reaction for harmful gas treatment. The plasma reaction part 110 includes an exhaust gas inlet 111 via which the exhaust gas including the harmful gas to be treated is introduced on an exhaust pipe (see 100a of FIG. 1), a plasma discharge part 120 which is located at a lower position than where the exhaust gas inlet 111 is located, and in which plasma discharge occurs, a gas introduction flow path 140 on which the exhaust gas including the harmful gas to be treated introduced via the exhaust gas inlet 111 is to be introduced into the plasma discharge part 120, and a passage extension part 150, which is located at a lower position than where the plasma discharge part 120 is located, and has a passage area increasing as getting closer to downstream.

The exhaust gas inlet 111 is located at a front end of the plasma reaction part 110, and the exhaust gas including the harmful gas to be treated is introduced onto the gas introduction flow path 140 via the exhaust gas inlet 111. In the present embodiment, the exhaust gas introduced via the exhaust gas inlet 111 includes perfluorocarbons (PFCs), such as carbon tetrafluoride ($CF_4$), and an ammonium chloride ($NH_4Cl$) gas. However, embodiments are not limited thereto. The ammonium chloride ($NH_4Cl$) gas is formed by combining a nitrogen ($N_2$) gas contained in the exhaust gas with other components.

The plasma discharge part 120 is located at a lower position than where the exhaust gas inlet 111 is located, and causes plasma discharge for plasma reaction. The plasma discharge part 120 includes an ignition electrode 130 installed in a discharge space 121. The discharge space 121 has a cylindrical shape that extends mostly horizontally, and the ignition electrode 130 is installed in the discharge space 121, and the discharge space 121 communicates with a passage extension part 150 at a rear end of the discharge space 121 in a flow direction of the exhaust gas. The exhaust gas is introduced into the discharge space 121 from the gas introduction flow path 140. Plasma discharge occurs in the discharge space 121 by the ignition electrode 130, and the harmful gas contained in the exhaust gas is decomposed by plasma discharge. The harmful gas to be treated communicates with the gas introduction flow path 140 in the discharge space 121 and is introduced via a plurality of exhaust gas inlets 125 located at an inner circumferential surface of the discharge space 121. Although not shown, each of the plurality of exhaust gas inlets 125 extends to deviate from a central axial line of the discharge space 121 so that the exhaust gas introduced into the discharge space 121 forms swirl. The exhaust gas forms swirl in the discharge space 121 so that a plasma reaction section can be uniformly formed. Also, ignition gas (nitrogen ($N_2$) gas in the present embodiment) is introduced into the discharge space 121 via an ignition gas inlet 127. Although not shown, the ignition gas inlet 127 is configured to form swirl in the discharge space 121. The ignition electrode 130 is located at the center of the discharge space 121 and causes plasma discharge. In the present embodiment, a direct current (DC) power supply with low power is applied to the ignition electrode 121 so that plasma discharge occurs. However, embodiments are not limited thereto. According to plasma discharge caused by the ignition electrode 130, strong plasma is formed at a distal end of the ignition electrode 130.

On the gas introduction flow path 140, the exhaust gas introduced via the exhaust gas inlet 111 is moved outside the discharge space 121 in a circumferential direction. The exhaust gas moved outside the discharge space 121 in the circumferential direction through the gas introduction flow path 10 is injected into the discharge space 121 via the exhaust gas inlet 125 so as to form swirl.

The passage extension part 150 is located at a lower position than where the plasma discharge part 120 is located, and is connected to the discharge space 121. The passage extension part 150 has a shape of a funnel of which passage area is increased as getting closer to downstream, and plasma having a swirl shape occurs in the passage extension part 150 so that plasma movability can be maximized and temperature can be overall transferred up to the catalyst treatment part 160. The gas that passes through the passage extension part 150 is introduced into the catalyst treatment part 160.

The catalyst treatment part 160 decomposes the harmful gas treated via the plasma reaction part 110 using a catalyst and treats the harmful gas. The catalyst treatment part 160 includes a catalyst 170 filled in a catalyst accommodation space 161.

The catalyst accommodation space 161 has a cylindrical shape that extends mostly horizontally, and a gas introduction part 162 and a gas discharge part 163 are formed at both ends of the catalyst accommodation space 161 that are horizontally arranged. The gas introduction part 162 is connected to the passage extension part 150 so that the exhaust gas including the harmful gas having low concentration that passes through the passage extension part 150 via the gas introduction part 162 flows into the catalyst accommodation space 161.

The catalyst 170 is filled in the catalyst accommodation space 161. The catalyst that is generally used to treat the harmful gas, decomposes the harmful gas through selective adsorption and a surface chemical reaction of the harmful gas.

Figure 5:
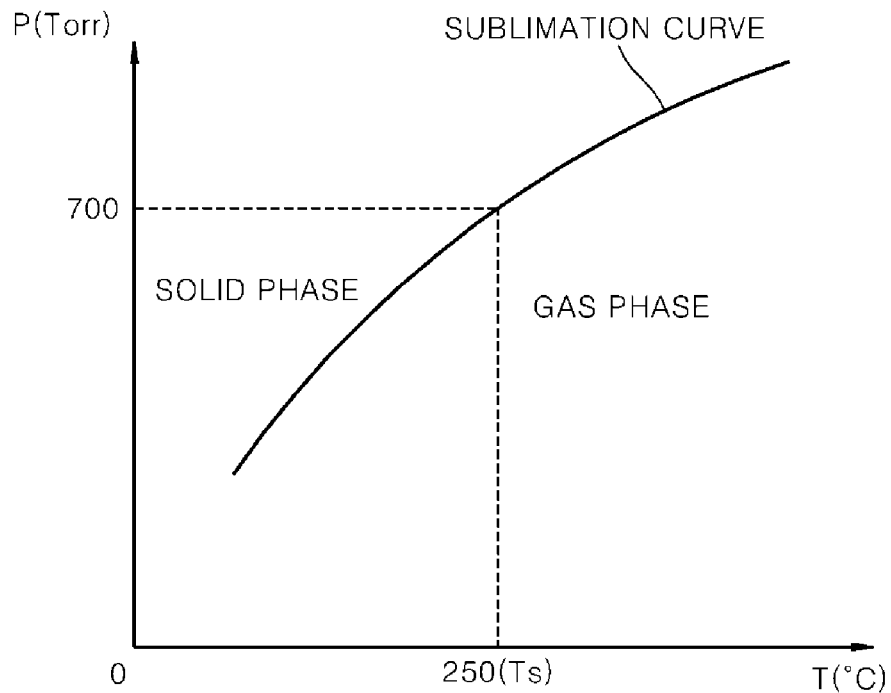
FIG. 5 is a graph showing temperature versus pressure showing sublimation conditions of ammonium chloride.

The harmful gas treatment device 100 is installed at an appropriate position of the exhaust pipe 100a so that no powder may be generated in the exhaust pipe 100a. Hereinafter, the installation position of the harmful gas treatment device 100 will be described. In the current embodiment, the ammonium chloride ($NH_4Cl$) gas is sublimated in the exhaust pipe 100a so that powder may be generated. FIG. 5 illustrates temperature and pressure (partial pressure) conditions in which the ammonium chloride ($NH_4Cl$) gas is sublimated in the exhaust pipe 100a so that powder may be generated. For example, the ammonium chloride ($NH_4Cl$) gas is sublimated at a temperature that is equal to or lower than 250° C. under a pressure of 700 Torr so that powder may be generated. Based on the sublimation condition of the ammonium chloride ($NH_4Cl$) gas, the harmful gas treatment device 100 is installed at a position (see Ps in FIGS. 1 and 2) where the temperature of the exhaust gas in the exhaust pipe 100a corresponds to the sublimation temperature (see Ts in FIG. 2) of the ammonium chloride ($NH_4Cl$) gas. For example, when the pressure of the ammonium chloride ($NH_4Cl$) gas in the exhaust gas 100a is 700 Torr, the harmful gas treatment device 100 is installed at a position where the temperature of the ammonium chloride ($NH_4Cl$) gas corresponds to 250° C. that is the sublimation temperature, so that the temperature of the exhaust gas rises according to a plasma reaction of the harmful gas treatment device 100 and thus sublimation of the ammonium chloride ($NH_4Cl$) gas is prevented. In the present embodiment, the harmful gas treatment device 100 is installed at the position Ps of the exhaust pipe 100a corresponding to the sublimation temperature of the ammonium chloride ($NH_4Cl$) gas. However, unlike this, the harmful gas treatment device 100 may also be installed between the rear end of the vacuum pump P and the position Ps corresponding to the sublimation temperature of the ammonium chloride ($NH_4Cl$) gas. This also belongs to the scope of the present invention. That is, the harmful gas treatment device 100 may be positioned in a section including the sublimation condition occurrence point Ps at which sublimation condition of a sublimable component occurs in the exhaust pipe 100a are constituted, and an upstream side of the point Ps. Also, in the present embodiment, the whole of the harmful gas treatment device 100 is installed between the rear end of the vacuum pump P and the position Ps of the exhaust pipe 100a that corresponds to the sublimation temperature of the ammonium chloride ($NH_4Cl$) gas. However, unlike this, the plasma reaction part 110 of the harmful gas treatment device 100 that is a heating means may also be installed between the rear end of the vacuum pump P and the position Ps of the exhaust pipe 100a corresponding to the sublimation temperature of the ammonium chloride (NH₄Cl) gas. This also belongs to the scope of the present invention.

In the present embodiment, the harmful gas treatment device 100 includes the plasma reaction part 110 and the catalyst treatment part 160. However, unlike this, the harmful gas treatment device 100 includes only the plasma reaction part 110 and this also belongs to the scope of the present invention.

In the present embodiment, gas being sublimated to generate powder is the ammonium chloride (NH₄Cl) gas. However, embodiments are not limited thereto but apply to different types of gases for generating powder. This also belongs to the scope of the present invention.

In the above-described embodiment, the harmful gas treatment device 100 is positioned on the exhaust pipe 100a. However, unlike this, the harmful gas treatment device 100 may be positioned between the rear end of the vacuum pump P and the front end of the exhaust pipe 100a. This also belongs to the scope of the present invention. When the harmful gas treatment device is positioned at the front end of the exhaust pipe, the harmful gas treatment device 100 may be manufactured as a single body with the vacuum pump P and modulated in the vacuum pump P.

In the present embodiment, the harmful gas treatment device 100 is installed outside the vacuum pump P. Unlike this, the harmful gas treatment device 100 may also be installed inside the vacuum pump P (this means an inside of a case of the vacuum pump P). This also belongs to the scope of the present invention.

When a harmful gas treatment device is installed outside a vacuum pump, the harmful gas treatment device may be installed on an exhaust pipe that extends horizontally, on the exhaust pipe that extends vertically, or to be inclined with respect to the exhaust pipe that extends horizontally. When the harmful gas treatment device is installed outside the vacuum pump, it is advantageous in terms of maintenance such as replacement of the harmful gas treatment device. When the harmful gas treatment device is installed on the exhaust pipe that extends horizontally, in particular, the length of the exhaust pipe may be minimized. When the harmful gas treatment device is installed inside the vacuum pump, the size of a device may be minimized.

An operation of a piping apparatus having the above structure according to an embodiment of the present invention will be described as below.

Exhaust gas discharged by the vacuum pump P flows along the exhaust pipe 100a, and the temperature of the exhaust gas is gradually decreased, as shown in FIG. 2. Because the harmful gas treatment device 100 is installed before the temperature of the exhaust gas is decreased to the sublimation temperature Ts of the sublimable component, the exhaust gas is heated by the plasma reaction part 110 that is a heating means, before the temperature of the exhaust gas is decreased to the sublimation temperature Ts.

Because the temperature of the exhaust gas is increased again by the plasma reaction part 110, the exhaust gas does not reach the sublimation temperature Ts. Thus, sublimation of the sublimable component may be prevented and thus, generation of powder within the exhaust pipe 100a may be prevented.

Thus, in the present invention, the harmful gas treatment device 100 is installed at the previous position to the sublimation point Ps where sublimation of the sublimable component occurs, so that a sublimation phenomenon may be prevented in advance.

Figure 6:
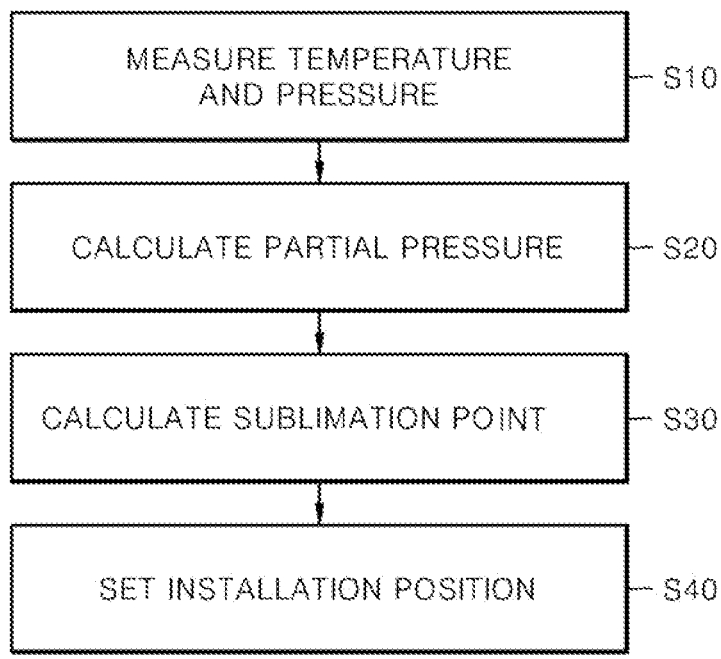
FIG. 6 is a flowchart schematically illustrating a design method for a piping apparatus according to an embodiment of the present invention.

FIG. 6 is a flowchart illustrating a design method for the above-described piping apparatus according to an embodiment of the present invention. Referring to FIG. 6, the design method for the piping apparatus includes measuring temperature and pressure (S10), calculating partial pressure (S20), calculating a sublimation point (S30), and setting an installation position (S40).

In the measuring of the temperature and pressure (S10), the temperature and pressure of exhaust gas that flows through an exhaust pipe (see 100a of FIG. 1) are measured before a harmful gas treatment device (see 100 of FIG. 1) is installed. In the measuring of the temperature and pressure (S10), while a discharge simulation in which the exhaust gas is discharged through the exhaust pipe (see 100a of FIG. 1) of a vacuum pump (see P of FIG. 1) is performed, the temperature and pressure of the exhaust gas are measured by a sensor, and the measured temperature and pressure data are collected in a computer.

In the calculating of the partial pressure (S20), the pressure of the sublimable component (in the present embodiment, ammonium chloride (NH₄Cl)) among components included in the exhaust gas is calculated by the computer.

In the calculating of the sublimation point (S30), a position where the temperature of the exhaust gas reaches a sublimation temperature with respect to the pressure of a sublimable component calculated in the calculating of the partial pressure (S20)(in the present embodiment, ammonium chloride (NH₄Cl)) is calculated by the computer as a sublimation point.

In the setting of the installation position (S40), a section including the sublimation point calculated in the calculating of the sublimation point (S30) and an upstream side of the sublimation point is set as an installable position of the harmful gas treatment device (see 100 of FIG. 1).

Figure 7:
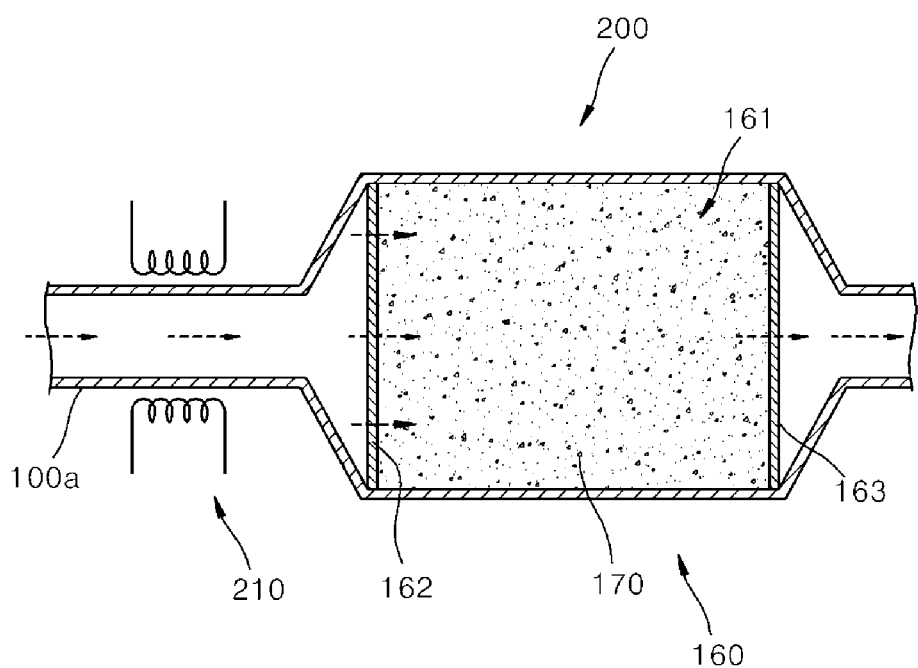
FIG. 7 is a longitudinal cross-sectional view showing the harmful gas treatment device illustrated in FIG. 1 according to another embodiment of the present invention.

FIG. 7 is a longitudinal cross-sectional view showing a harmful gas treatment device according to another embodiment of the present invention. Referring to FIG. 7, a harmful gas treatment device 200 includes a heater 210 and a catalyst treatment part 160, which is positioned at a lower position than where the heater 210 is located and which treats a harmful gas contained in exhaust gas using a catalyst.

The heater 210 that is a heating means that is installed on the exhaust pipe 100a and heats the exhaust gas that flows through the exhaust pipe 100a, has been described as a heater in the present embodiment. However, embodiments are not limited thereto, and all types of heater for rising the temperature of the exhaust gas to be equal to or higher than a setting temperature may be used.

The catalyst treatment part 160 is located at a lower position than where the heater 210 is located, and treats the harmful gas contained in the exhaust gas heated by the heater 210 using the catalyst. The catalyst treatment part 160 includes a catalyst 170 filled in the catalyst accommodation space 161. The catalyst accommodation space 161 has a cylindrical shape that extends mostly horizontally and includes a gas inlet part 162 and a gas discharge part 163, which are installed horizontally at both ends of the catalyst accommodation space 161. The exhaust gas including the harmful gas is introduced into the catalyst accommodation space 161 via the gas inlet part 162.

The catalyst 170 is filled in the catalyst accommodation space 161. The catalyst that is generally used to treat the harmful gas, decomposes the harmful gas using selective adsorption and a surface chemical reaction of the harmful gas.

The harmful gas treatment device 200 shown in FIG. 7 is installed at the previous position where a sublimation condition of a sublimable component included in the exhaust gas occurs, like in the method described in FIG. 6.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A piping apparatus through which exhaust gas discharged from a process chamber via a vacuum pump flows, the piping apparatus comprising:
   an exhaust pipe providing a passage through which the exhaust gas discharged by the vacuum pump flows; and
   a harmful gas treatment device positioned on the exhaust pipe so as to treat a harmful gas contained in the exhaust gas,
   wherein the harmful gas treatment device comprises a heating means for increasing the temperature of the exhaust gas so as to prevent a sublimable component, from among components included in the exhaust gas, from being sublimated and accumulated inside the exhaust pipe, and
   the heating means is positioned on a section including a sublimation condition occurrence point, at which a sublimation condition of the sublimable component occurs, and an upstream side of the sublimation condition occurrence point on the exhaust pipe, and
   the sublimation condition is a temperature condition for the pressure of the sublimable component,
   wherein the heating means comprises a plasma reaction part for decomposing the harmful gas using a plasma reaction.

2. The piping apparatus of claim 1, wherein the sublimable component is an ammonium chloride ($NH_4Cl$) gas.

3. The piping apparatus of claim 1, wherein the harmful gas treatment apparatus further comprises a catalyst treatment part for decomposing the harmful gas using a catalyst.

4. A harmful gas treatment facility comprising:
   a vacuum pump for discharging exhaust gas including a harmful gas generated in a process chamber;
   an exhaust pipe providing a passage through which the exhaust gas discharged by the vacuum pump flows; and
   a harmful gas treatment device positioned on the exhaust pipe so as to treat a harmful gas contained in the exhaust gas,
   wherein the harmful gas treatment device comprises a heating means for increasing the temperature of the exhaust gas so as to prevent a sublimable component, from among components included in the exhaust gas, from being sublimated and accumulated inside the exhaust pipe, and
   the heating means is positioned on a section including a sublimation condition occurrence point of the exhaust pipe, at which a sublimation condition of the sublimable component occurs, and an upstream side of the sublimation condition occurrence point on the exhaust pipe, and
   the sublimation condition is a temperature condition for the pressure of the sublimable component,
   wherein the heating means comprises a plasma reaction part for decomposing the harmful gas using a plasma reaction.

5. The harmful gas treatment facility of claim 4, wherein the sublimable component is an ammonium chloride ($NH_4Cl$) gas.

6. The harmful gas treatment facility of claim 5, wherein the harmful gas treatment device is installed in a section of the exhaust pipe in which pressure of the ammonium chloride ($NH_4Cl$) gas is equal to or less than 700 Torr and temperature of the exhaust gas is equal to or higher than 250° C.

7. The harmful gas treatment facility of claim 4, wherein the harmful gas treatment device further comprises a catalyst treatment part for decomposing the harmful gas using a catalyst.

8. The harmful gas treatment facility of claim 4, further comprising a scrubber for treating the exhaust gas discharged from the exhaust pipe.

9. A piping apparatus in which exhaust gas discharged from a process chamber by a vacuum pump flows, the piping apparatus comprising:
   an exhaust pipe providing a passage through which the exhaust gas discharged by the vacuum pump flows; and
   a harmful gas treatment device positioned on the exhaust pipe so as to treat a harmful gas contained in the exhaust gas,
   wherein the harmful gas treatment device comprises a heating means for increasing the temperature of the exhaust gas so as to prevent a sublimable component, from among components included in the exhaust gas from being sublimated and accumulated inside the exhaust pipe, and
   the heating means is positioned on a section including a sublimation condition occurrence point, at which a sublimation condition of the sublimable component occurs, and an upstream side of the sublimation condition occurrence point on the exhaust pipe,
   wherein the heating means comprises a plasma reaction part for decomposing the harmful gas using a plasma reaction.

* * * * *